(12) United States Patent
Mirow

(10) Patent No.: US 9,140,579 B2
(45) Date of Patent: Sep. 22, 2015

(54) LOW POWER INDUCTIVE PROXIMITY SENSING SYSTEM

(71) Applicant: Fred Mirow, Lower Merion, PA (US)

(72) Inventor: Fred Mirow, Lower Merion, PA (US)

(*) Notice: Subject to any disclaimer, the term of this patent is extended or adjusted under 35 U.S.C. 154(b) by 197 days.

(21) Appl. No.: 14/035,321

(22) Filed: Sep. 24, 2013

(65) Prior Publication Data

US 2015/0084646 A1    Mar. 26, 2015

(51) Int. Cl.
*G01R 27/28* (2006.01)
*G01D 5/20* (2006.01)
*H03K 17/95* (2006.01)

(52) U.S. Cl.
CPC ............ *G01D 5/20* (2013.01); *H03K 17/951* (2013.01); *H03K 17/9525* (2013.01)

(58) Field of Classification Search
CPC ................. H03K 17/9547; G01B 7/023
USPC .......... 324/207.15, 207.16, 207.26, 654; 340/686.1, 686.6, 941
See application file for complete search history.

(56) References Cited

U.S. PATENT DOCUMENTS 4,906,924 A * 3/1990 Zannis ............... 324/207.18
5,498,958 A * 3/1996 Tu et al. ............. 324/207.16
2009/0243615 A1* 10/2009 Kuehn ................ 324/326

* cited by examiner

*Primary Examiner* — Melissa Koval
*Assistant Examiner* — Daniel Miller

(57) ABSTRACT

A low power inductive proximity sensing system in which a DC voltage to the inductors is only applied for a short time period needed to detect the presence or absence of an appropriate object. After the detection time period is over, DC voltage is no longer applied to the inductors.

4 Claims, 3 Drawing Sheets

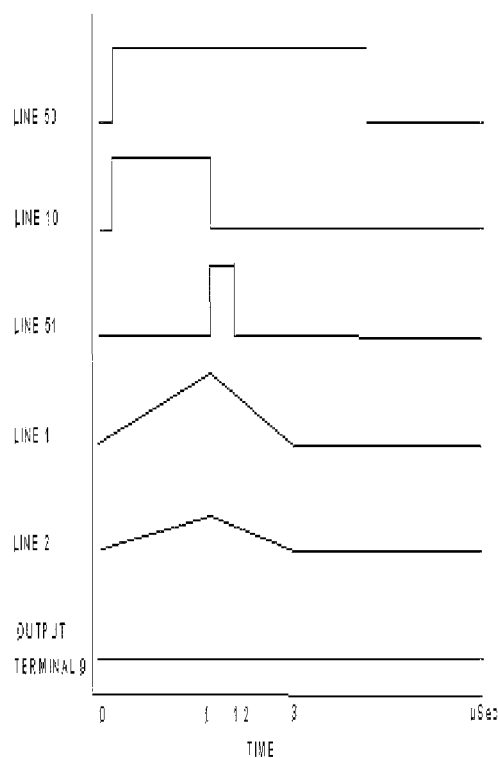
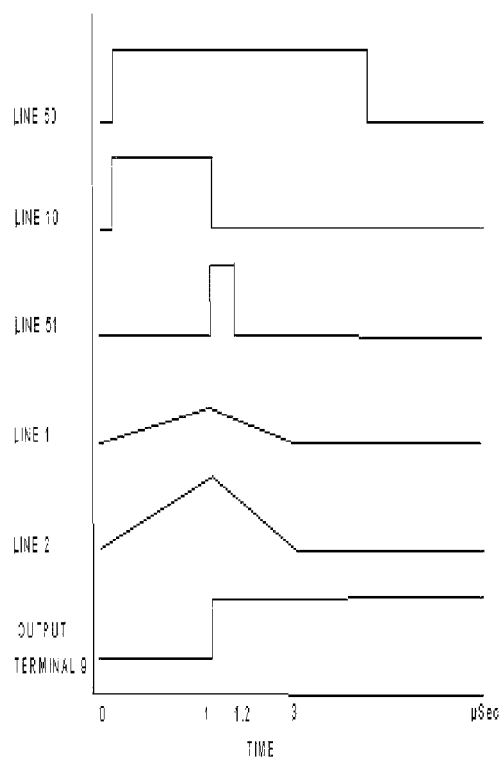

LOW POWER INDUCTIVE PROXIMITY SENSING SYSTEM

CROSS-REFERENCE TO RELATED APPLICATIONS

The benefits of filing this invention as Provisional application for patent "LOW POWER INDUCTIVE PROXIMITY SENSING SYSTEM", U.S. PTO 61744390 filed Sep. 25, 2012 filed by Fred Mirow are claimed.

BACKGROUND OF THE INVENTION

The present invention relates to reducing the operating power of inductive proximity sensors.

BACKGROUND OF THE INVENTION

Presently available inductive proximity sensors require a high operating power which restricts their use in battery powered applications. The present invention uses reduced operating power by only applying power from a DC voltage supply to the inductor for a short time period needed to detect the presence or absence of an appropriate object. After the detection time period is over, DC voltage supply power is no longer applied to the inductor. As long as DC voltage supply power is applied to the inductor the current level increases. In the case of a capacitor the current level decreases with time. By waiting a relatively long time period between reapplication of DC voltage supply power to the inductor the power duty cycle is low causing the average power to be low. In addition by using CMOS logic circuitry which uses substantially no power, except during circuit signal level transitions, total sensor power is further reduced.

In addition the effects of temperature, supply voltage, and manufacturing tolerance can be reduced by using matched components and also ratios instead of absolute electrical values in the critical circuit sections. Most components especially those that are part of an Integrated Circuit can be readily built with a high level of electrical parameter matching while their absolute values have wide variations.

An objective of the present invention is to provide an inductive proximity sensor that operates at a low power level.

It is an additional object of the invention to provide an inductive proximity sensor that uses circuits that are less susceptible to process variances by relying on matched components and also ratios instead of absolute electrical values thereby providing a more consistently manufacturable circuit.

An additional object of the invention is to provide an inductive proximity sensor that uses circuits that have fast response time allowing a quick response to objects being sensed.

It is a further object of the invention to provide an inductive proximity sensor that uses circuits that are less susceptible to temperature and supply voltage variances by relying on matched components and also ratios instead of absolute electrical values.

BRIEF SUMMARY OF THE INVENTION

According to this invention, DC voltage supply power to the inductors is only applied for a short time period needed to detect the presence or absence of an appropriate object. After the detection time period is over, DC voltage supply power is no longer applied to the inductors. Most of the inductive proximity sensors power is used to operate the inductors. By powering the inductors for a relatively short time period and then waiting a relatively long time period between reapplication of power to the inductors, the power duty cycle is low causing the inductive proximity sensors average power to be low. In addition by using CMOS logic circuitry which uses substantially no power, except during circuit signal level transitions, total sensor power is further reduced.

For best accuracy matched parts and using ratio of parts with matching temperature coefficients to determine circuit operation are used to build the critical circuits.

BRIEF DESCRIPTION OF DRAWINGS

FIG. 5 is a timing diagram for low power inductive proximity sensing system 1 with the absence of an appropriate object sensed, and FIG. 6 is a timing diagram for low power inductive proximity sensing system 1 with the presence of an appropriate object sensed.

DETAILED DESCRIPTION OF THE INVENTION

Figure 1:
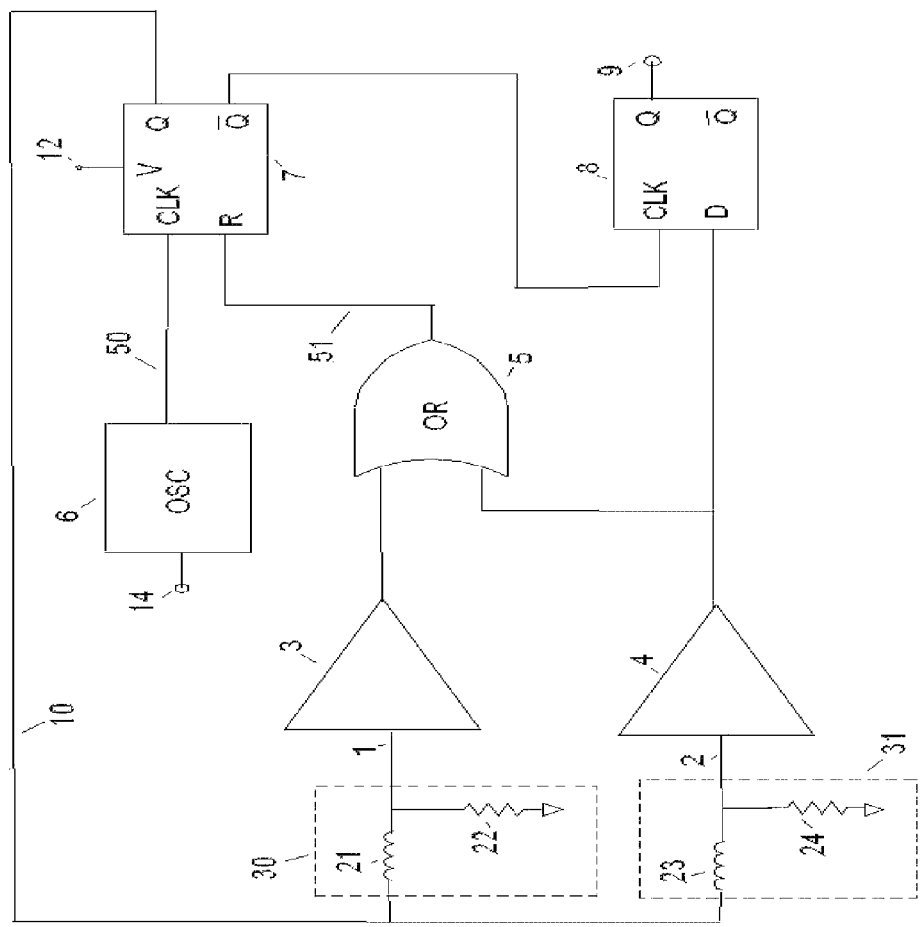
FIG. 1 is a block diagram illustrating an electrical configuration of a low power inductive proximity sensing system 1 according to a exemplary embodiment of the present invention.

FIG. 1 shows an exemplary low power inductive proximity sensing system 1 in accordance with an embodiment of the present invention. Flip Flop 7 receives input signals to its clock input from Oscillator 6 on line 50 and the reset input from the output of OR gate 5 on line 51. Also terminal 12 is connected to a DC voltage supply. Level Detector 4 receives an input signal on line 2 and its output is connected to both Flip Flop 8 input D and also one of OR gate 5 inputs. Level Detector 3 receives an input signal on line 1 and its output is connected to the other OR gate 5 input.

The Q output of Flip Flop 7 is connected to line 10. Flip Flop 7 Q bar output (Q with bar above it meaning having the inverted output signal level of Q) is connected to the clock input of Flip Flop 8. The Q output of Flip Flop 8 is connected to output terminal 9.

Time Delay 30 has one terminal of Inductor 21 connected to line 10. The other terminal of Inductor 21 is connected to line 1. One terminal of Resistor 22 is connected to line 1 and its other terminal is connected to ground.

Time Delay 31 has one terminal of Inductor 23 connected to line 10. The other terminal of Inductor 23 is connected to line 2. One terminal of Resistor 24 is connected to line 2 and its other terminal is connected to ground.

Level Detector 3 output changes from low to high level when the signal level on line 1 exceeds a set level and Level Detector 4 output changes from low to high level when the signal level on line 2 exceeds a set level. Preferably the set signal level of Level Detector 3 and 4 and their circuits are substantially the same to reduce the effects of temperature, supply voltage, and manufacturing tolerance. While comparators or CMOS inverters may be used to perform the function of Level Detector 3 and 4, Schmidt trigger circuits are preferable because they use less power and have faster response time.

When either Level Detector 3 or 4 output signal changes from low to high level, the OR gate 5 output signal changes from low to high level causing the Q output of Flip Flop 7 to go to a low signal level and its Q bar output to a high signal level. When the Flip Flop 7 Q bar output signal changes from low to high level, the output signal level of Level Detector 4 determines the Flip Flop 8 Q output until the next time Flip Flop 7 Q bar output signal changes from low to high level again. Flip Flop 8 Q output signal level is applied to output terminal 9. The signal level at output terminal 9 indicates the presence or absence of an appropriate object.

Clock 6 generates a pulse output signal, which does not need be a square wave. When Clock 6 generates an output signal going to a high level, the Q output of Flip Flop 7 becomes a high signal level. When the Q output of Flip Flop 7 is a high signal level, voltage is applied from terminal 12 to line 10 and when the Q output is a low signal level, line 10 is substantially connected to ground.

The repetitive rate at which Clock 6 is set to generate a high output signal depends on the rate at which the object to be sensed is required to be sensed. For example Clock 6 may generate a high output signal of 1 micro second duration that has a repetitive rate of 10 times a second. The time period of Clock 6 output signal is under all conditions longer than the time required for the first of either Level Detector 3 or 4 output signal level to go high and then also for the voltage levels on lines 1 and 2 to have been significantly reduced towards 0 volts. It is also understood the repetitive rate maybe controlled by an external signal applied to terminal 14.

Time Delay 30 provides a voltage level time delay between its input on line 10 and output on line 1. The combination of Inductor 21 and Resistor 22 produces a time constant that is affected by the presence of an appropriate object which causes Inductor 21 to change inductance level. As the Inductor 21 inductance level increases, the time constant increases, and the voltage level rise time (which is the time required to reach a given voltage level on line 1) increases. In the case where the Inductor 21 inductance level decreases, the voltage level rise time required to reach a given voltage level on line 1 decreases.

Time Delay 31 provides a voltage level time delay between its input on line 10 and output on line 2. The combination of Inductor 23 and Resistor 24 produces a time constant that is affected by the presence of an appropriate object which causes Inductor 23 to change inductance level. As the Inductor 23 inductance level increases, the voltage level rise time required to reach a given voltage level on line 2 increases. In the case where the Inductor 23 inductance level decreases, the voltage level rise time required to reach a given voltage level on line 2 decreases.

In one example during operation one of either Inductor 23 or Inductor 21 is placed in proximity to the intended object to be sensed while the other Inductor is not. For an example Inductor 23 substantially matches Inductor 21. Also Resistor 24 substantially matches Resistor 22 except that Resistor 22 has a slightly higher resistance value but substantially the same temperature coefficient.

In this example when Inductor 23 is not near the target Level Detector 3 output level becomes high before that of Detector 4 which causes output terminal 9 signal level to be low. As Inductor 23 approaches a target that lowers its inductance value Detector 4 output level becomes high before that of Detector 3 which causes output terminal 9 signal level to be high.

In another example Resistor 24 substantially matches Resistor 22 except that Resistor 24 has a slightly higher resistance value but substantially the same temperature coefficient. When Inductor 23 is not near the target Level Detector 4 output level becomes high before that of Detector 3 which causes output terminal 9 signal level to be high. As Inductor 23 approaches a target that increases its inductance value, Detector 3 output level becomes high before that of Detector 4 which causes output terminal 9 signal level to be low.

In some applications in which the best performance over a wide temperature range is required the object to be sensed can be physically moved so as to become closer to inductor 23 as it becomes further away from inductor 21, or vice a versa.

Figure 2:
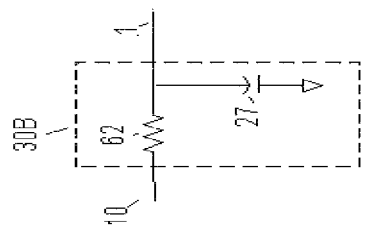
FIG. 2 is a circuit diagram of Time Delay 30B.

In some other applications in which the best performance over a wide temperature range is not required Time Delay 30B FIG. 2 can be used. Resistor 62 is connected between input line 10 and output on line 1. Capacitor 27 is connected between output on line 1 and ground.

Time Delay 30B provides a voltage level time delay between its input online 10 and output on line 1. The combination of Capacitor 27 and Resistor 62 generates a fixed time constant. When using Time Delay 30B, Inductor 23 is used to sense the target presence.

Figure 3:
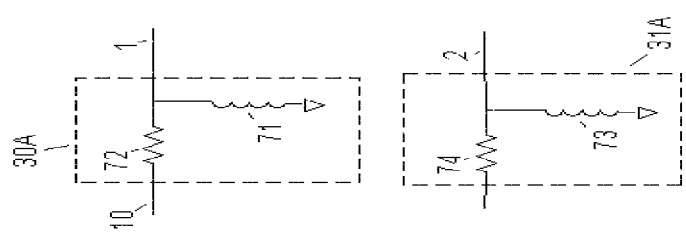
FIG. 3 is a circuit diagram of Time Delay 30A and Time Delay 31A.

In some additional applications it may be preferable to have the voltage level on lines 1 and 2 decreases with time instead of increasing. In these applications Time Delay 30A and 31A in FIG. 3 can be used. Time Delay 31A has Resistor 74 connected between input line 10 and output on line 1. Inductor 73 is connected between output on line 1 and ground. Time Delay 30A has Resistor 72 connected between input line 10 and output on line 1. Inductor 71 is connected between output on line 1 and ground. It is understood in this case that the output signals of both level detector 3 and 4 would need to be inverted.

Figure 4:
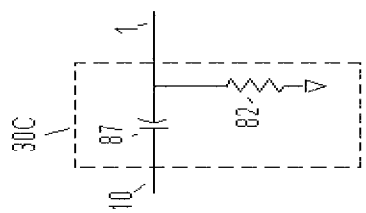
FIG. 4 is a circuit diagram of Time Delay 30C.

Time Delay 30C FIG. 4 uses a capacitor to cause the voltage level on lines 1 to decrease with time instead of increasing. Time Delay 30C has Capacitor 87 connected between input line 10 and output on line 1. Resistor 82 is connected between output on line 1 and ground. It is understood in this case that the output signal of level detector 3 would need to be inverted.

FIG. 5 is a timing diagram for low power inductive proximity sensing system 1 in FIG. 1 with the absence of an appropriate object sensed. At time 0, Clock 6 generates a output signal level going high on line 50 causing line 10 to have voltage applied to it. The voltage level on lines 1 starts to increase from 0 volts faster than that of line 2 with time. At 1 micro second the voltage level on line 1 exceeds the set level which causes Level Detector 3 output to change from low to high level and the signal level on line 51 goes high. The voltage applied to line 10 is now reduced to substantially 0 volts. The voltage level on line 2 did not exceed the set level which causes Level Detector 4 output to change from low to high level and the signal level at output terminal 9 remains low. The signal level on line 51 remains high level till 1.2 micro second at which time the voltage level on line 1 is below the set level causing Level Detector 3 output to change from high to low level. At 3 micro second the voltage levels on line 1 and 2 have returned to substantially 0 volts.

FIG. 6 is a timing diagram for low power inductive proximity sensing system 1 with the presence of an appropriate object causing the effective inductance of Inductor 23 to be reduced. At time 0, Clock 6 generates a output signal level going high on line 50 causing line 10 to have voltage applied to it. The voltage level on lines 2 starts to increase from substantially 0 volts faster with time than that of line 1. At 1 micro second, the voltage level on line 2 exceeds the set level which causes Level Detector 4 output to change from low to high level and the signal level on line 51 goes high. The voltage applied to line 10 is now reduced to substantially 0 volts. Also, the signal level at output terminal 9 now becomes high. The voltage level on line 1 did not exceed the set level which causes Level Detector 3 output to change from low to high level. The signal level on line 51 remains high level till 1.2 micro second at which time the voltage level on line 2 is below the set level causing Level Detector 4 output to change from high to low level. At 3 micro second, the voltage levels on line 1 and 2 have returned to substantially 0 volts.

The time values used in timing diagrams FIGS. 5 and 6 are just arbitrary values used to illustrate the system operation. In addition for clarity, the time delays of the individual circuit blocks are left out except for that of Time Delay 30 and 31.

What is claimed is:

1. An inductive proximity detector comprising:
   a first inductor and a second inductor wherein the inductance value of one or both of said first and second inductors varies in response to proximity of an object to be sensed;
   first and second time delays comprising said first and second inductors, respectively;
   a first time constant of said first time delay responsive to the inductance value of said first inductor;
   a second time constant of said second time delay responsive to the inductance value of said second inductor;
   an oscillator for controlling a time at which a DC voltage is applied to inputs of both said first and second time delays;
   a first voltage level detector having a first output signal level responsive to said first time constant;
   a second voltage level detector having a second output signal level responsive to said second time constant;
   said first or second voltage level detector determining a time at which said DC voltage is no longer applied to both said first and second time delays;
   a comparison circuit determining an output signal by comparing said first time constant to said second time constant, said output signal indicative of a presence or absence of said object to be sensed; and
   said oscillator having a time period longer than said first time constant and said second time constant.

2. The oscillator of claim 1 having a repetitive rate controlled by an external signal.

3. An inductive proximity detector comprising:
   an inductor wherein the inductance value of said inductor varies in response to proximity of an object to be sensed;
   a first time delay comprising said inductor;
   a second time delay circuit;
   a first time constant of said first time delay responsive to said inductance value of said inductor;
   a second time constant of said second time delay is substantially constant;
   an oscillator for controlling a time at which a DC voltage is applied to inputs of both said first and second time delays;
   a first voltage level detector having a first output signal level responsive to said first time constant;
   a second voltage level detector having a second output signal level responsive to said second time constant;
   said first or second voltage level detector determining a time at which said DC voltage is no longer applied to both said first and second time delays;
   a comparison circuit determining an output signal by comparing said first time constant to said second time constant, said output signal indicative of a presence or absence of said object to be sensed; and
   said oscillator having a time period longer than said first time constant and said second time constant.

4. The oscillator of claim 3 having a repetitive rate controlled by an external signal.

* * * * *